(12) United States Patent
Cho et al.

(10) Patent No.: US 9,811,056 B2
(45) Date of Patent: Nov. 7, 2017

(54) HIGH RESOLUTION TIME-TO-DIGITAL CONVERTOR

(71) Applicant: TAIWAN SEMICONDUCTOR MANUFACTURING CO., LTD., Hsin-Chu (TW)

(72) Inventors: Lan-Chou Cho, Hsin-Chu (TW);
Chewn-Pu Jou, Hsin-Chu (TW);
Feng-Wei Kuo, Hsin-Chu (TW);
Huan-Neng Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/422,523

(22) Filed: Feb. 2, 2017

(65) Prior Publication Data

US 2017/0146959 A1    May 25, 2017

Related U.S. Application Data

(62) Division of application No. 14/689,096, filed on Apr. 17, 2015, now Pat. No. 9,571,082.

(51) Int. Cl.
*H03M 1/50*    (2006.01)
*G04F 10/00*    (2006.01)
(Continued)

(52) U.S. Cl.
CPC ........... *G04F 10/005* (2013.01); *H03K 5/131* (2013.01); *H03K 5/1534* (2013.01); *H03K 2005/00058* (2013.01)

(58) Field of Classification Search
CPC .... G04F 10/005; H03K 5/131; H03K 5/1534; H03K 2005/00058; H03M 1/50; H03M 1/60
(Continued)

(56) References Cited

U.S. PATENT DOCUMENTS 8,327,179 B2 * 12/2012 Hsieh ................... G04F 10/005
713/500
8,344,772 B2    1/2013 Lee
(Continued)

FOREIGN PATENT DOCUMENTS

KR    2010-0133488    12/2010
KR    2010-0134628    12/2010

OTHER PUBLICATIONS

Staszewski, R. et al, "1.3 V 20 ps time-to-digital converter for frequency synthesis in 90-nm CMOS", IEEE Transactions on Circuits and Systems II: Express Briefs, 2006, 53(1):220-224.
(Continued)

*Primary Examiner* — Khai M Nguyen
(74) *Attorney, Agent, or Firm* — Duane Morris LLP

(57) ABSTRACT

A circuit includes a time delta detector configured to receive an input clock signal and a reference clock signal and generate a delta pulse signal and a reference pulse signal. A comparison circuit is configured to receive the delta pulse signal and the reference pulse signal. The comparison circuit generates an output indicative of a bit of a time difference between the input clock signal and the reference clock signal. A control circuit is configured to receive the output from the comparison circuit. The control circuit maintains a count of the time difference between the input clock signal and the reference clock signal.

20 Claims, 8 Drawing Sheets

(51) Int. Cl.
  *H03K 5/1534* (2006.01)
  *H03K 5/131* (2014.01)
  *H03K 5/00* (2006.01)
(58) Field of Classification Search
  USPC .......................................................... 341/166
  See application file for complete search history.

(56) References Cited

U.S. PATENT DOCUMENTS

| | | | |
|---|---|---|---|
| 8,570,107 | B2 | 10/2013 | Guo |
| 8,896,477 | B2 * | 11/2014 | Dosho .................. G04F 10/005 341/155 |
| 9,571,082 | B2 * | 2/2017 | Cho .................... H03K 5/1534 |
| 2007/0127613 | A1 | 6/2007 | Prodanov |
| 2009/0219073 | A1 | 9/2009 | Sun et al. |
| 2009/0256601 | A1 | 10/2009 | Zhang et al. |

OTHER PUBLICATIONS

Official Action dated Jun. 19, 2017 in corresponding Korean Patent Application No. 2017-042563655.

* cited by examiner

HIGH RESOLUTION TIME-TO-DIGITAL CONVERTOR

CROSS-REFERENCE TO RELATED APPLICATION

This application is a divisional of U.S. application Ser. No. 14/689,096, filed on Apr. 17, 2015, and entitled "HIGH RESOLUTION TIME-TO-DIGITAL CONVERTOR," the disclosure of which is incorporated herein in its entirety.

BACKGROUND

In integrated circuits ("ICs"), a time-to-digital convertor (TDC) includes a circuit configured to recognize events and provide a digital representation of the timing of the event. For example, a TDC may be configured to output the time of arrival for one or more incoming pulses. TDCs may be used in many different applications in which a time interval between two or more signal pulses (such as, for example, start and stop pulses) needs to be determined.

Current TDC circuits include an inverter as a basic timing unit. Inverters include one or more gates that introduce a gate delay into the circuit. The gate delay of current inverter circuits is defined by limitations of a CMOS process used to fabricate the gates. TDC circuits fabricated using CMOS processes are limited by the capacitance between a device's gate and channel and also by the resistance of the channel and the signal traces. For example, for 10 nm technology, the CMOS process introduces a best-case inverter gate delay in the picosecond range, such as, for example, 10 psecs.

BRIEF DESCRIPTION OF THE DRAWINGS

The present disclosure is best understood from the following detailed description when read in conjunction with the accompanying drawings. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

This description of the exemplary embodiments is intended to be read in connection with the accompanying drawings, which are to be considered part of the entire written description.

In one embodiment, the disclosed time-to-digital convertor (TDC) circuits are configured to provide TDC resolution of better than at least 10 psecs. In some embodiments, the TDC circuit includes a time delta detector and a comparison circuit. In other embodiments, the TDC circuit includes a pulse generator, a spatial division multiplexing (SDM) circuit, and a counter.

Figure 1:
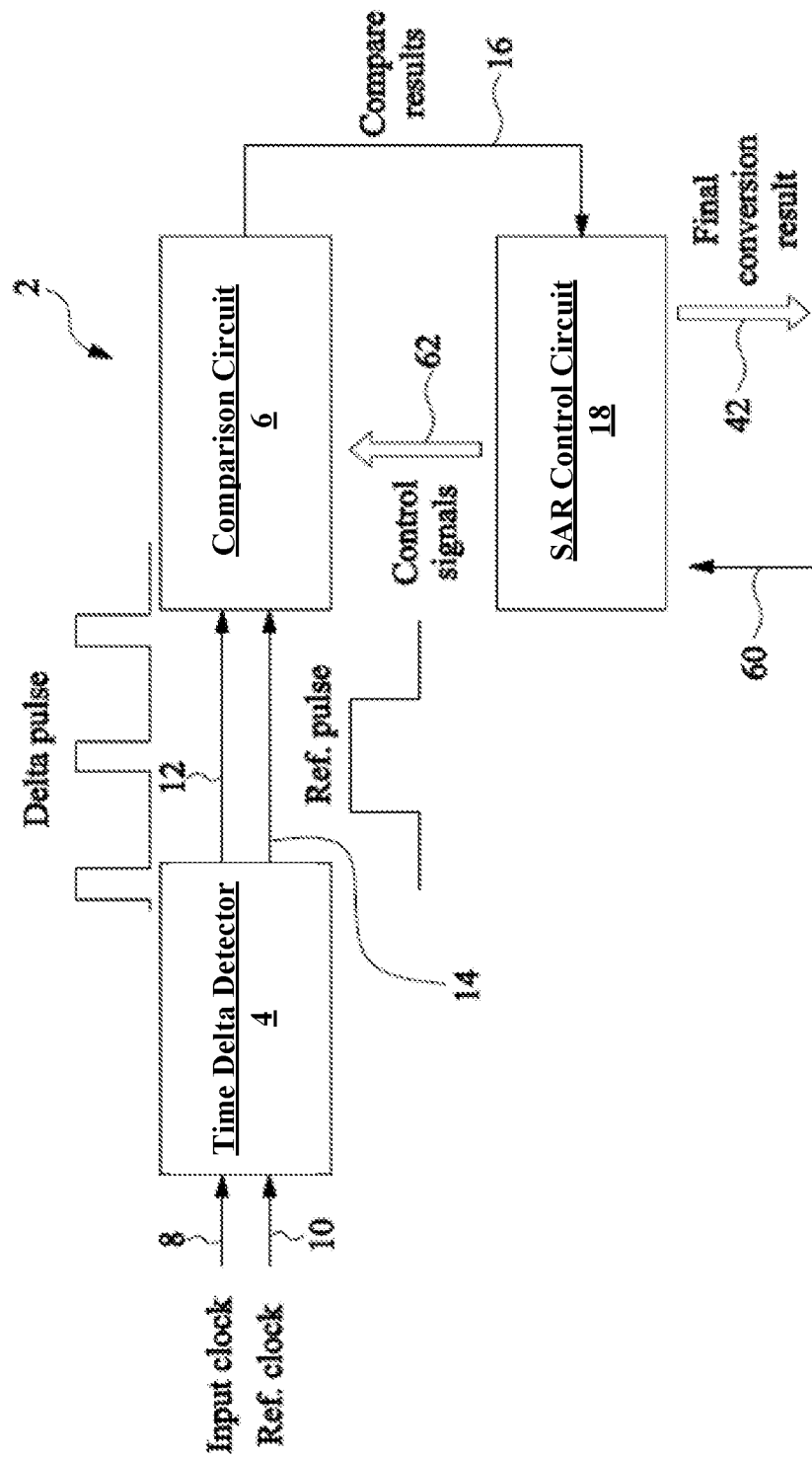
FIG. 1 illustrates one example embodiment of a time-to-digital convertor (TDC) circuit including a time delta detector and a comparison circuit.

FIG. 1 illustrates one embodiment of a TDC circuit 2 including a time delta detector 4 and a comparison circuit 6. The TDC circuit 2 is configured to generate a time difference count between the rising edges of two clock signals, such as, for example, an input clock signal 8 and a reference clock signal 10. The time difference count is generated by comparing a voltage developed over the period of an input, or delta, pulse to a voltage developed over the period of a reference pulse. The delta pulse and the reference pulse are related to the input clock signal 8 and the reference clock signal 10, respectively. One of the two clock signals, such as the input clock signal 8, may be multiple times faster, e.g., have a higher frequency, than the second signal, such as the reference clock signal. The TDC circuit 2 includes a time delta detector 4. The time delta detector 4 includes a pulse generator configured to generate one or more pulses based on the input clock signal 8 and the reference clock signal 10. For example, in one embodiment, the time delta detector 4 generates one or more output signals based on a time delta, or difference, between the input clock signal 8 and the reference clock signal 10. In some embodiments, the time delta detector 4 generates a delta pulse signal 12, a reference pulse signal 14, a polarity signal 36 (see FIG. 2), and/or a dump pulse signal 38 (see FIG. 2). The delta pulse signal 12 and the reference pulse signal 14 are provided to the comparison circuit 6.

The comparison circuit 6 is configured to generate a comparison result signal 16. The comparison result signal 16 is indicative of one or more bits of a binary count of the time difference between the input clock signal 8 and the reference clock signal 10. The comparison result signal 16 may be generated by, for example, comparing voltage values generated over the pulse periods of the delta pulse signal 12 and the reference pulse signal 14, as discussed in more detail below. The comparison result signal 16 is provided to a stand-alone regulator (SAR) control circuit 18. The SAR control circuit 18 is configured to maintain the count of the time difference between the rising edges of the input clock signal 8 and the reference clock signal 10. The SAR control circuit 18 can comprise internal circuitry (not shown) configured to maintain the count of the time difference, such as, for example, one or more registers, latches, and/or any other suitable circuitry for storing a binary count. The SAR control circuit 18 is further configured to generate control signals 62 for the comparison circuit 6 to control the weighting of the comparison signal 16. For example, in some embodiments, the SAR control circuit 18 is configured to adjust a circuit value, such as, for example, capacitance of a circuit, to adjust the voltages generated over the pulse periods of the delta pulse signal 12 and/or the reference pulse signal 14 to advance the comparison signal 16 from a most-significant bit (MSB) of the count to a least-significant bit (LSB), as discussed in more detail below with respect to FIG. 4. After all bits of the count (e.g., MSB to LSB) have been determined and stored, the SAR control circuit 18 generates a final conversion result signal 72 to output the count to one or more additional circuits. The final conversion result signal 72 may output the bits of the count in serial and/or parallel.

Figure 2:
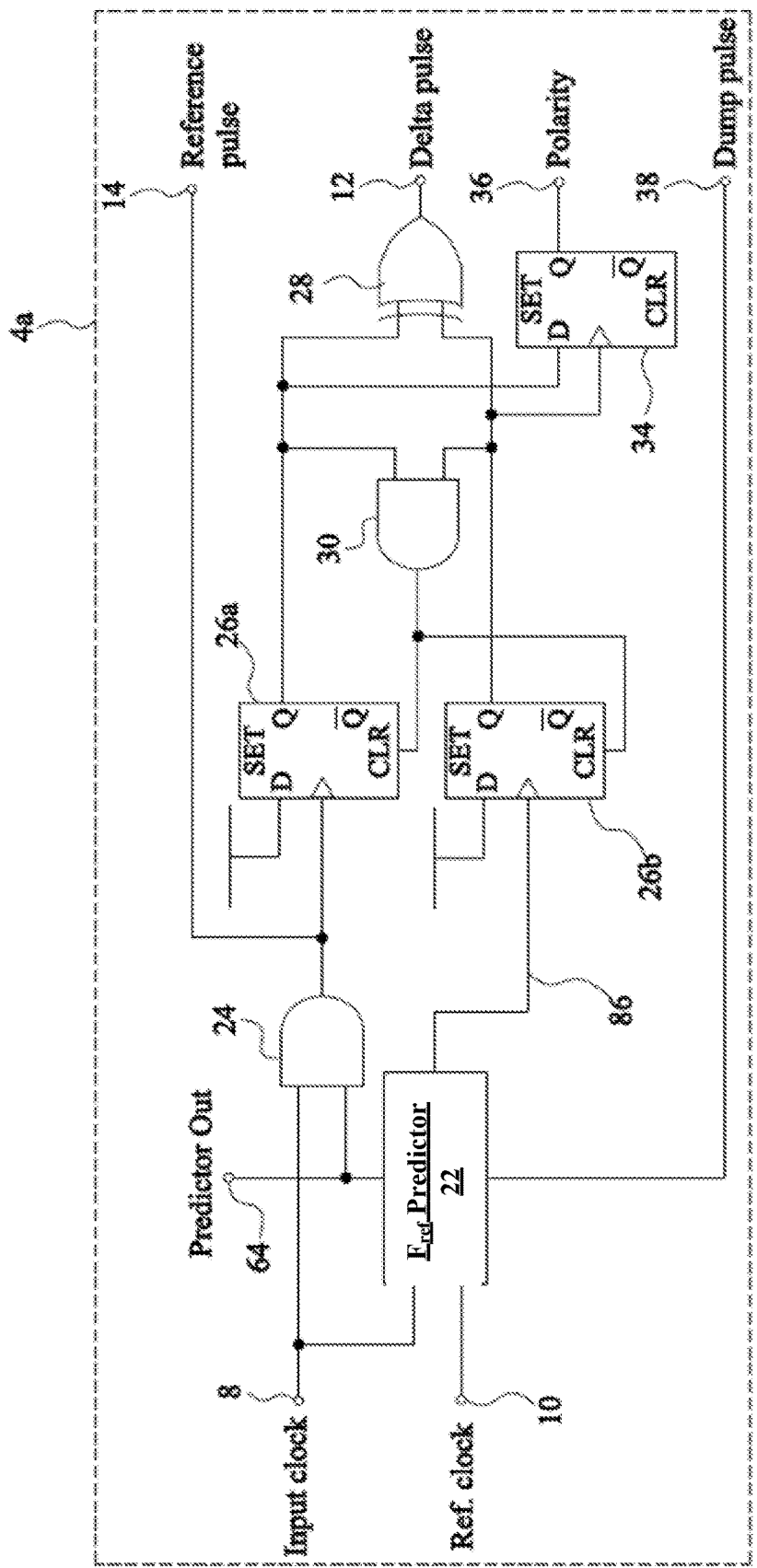
FIG. 2 illustrates one embodiment of the time delta detector of the TDC circuit of FIG. 1.

FIG. 2 illustrates one embodiment of a time delta detector 4a. The time delta detector 4a receives the input clock signal 8 and the reference clock signal 10 and generates one or more output signals, such as, for example, a delta pulse signal 12, a reference pulse signal 14, a polarity signal 36, and a dump pulse signal 38. The time delta detector 4a generates the delta pulse signal 12 by comparing input clock signal 8 and the reference clock signal 10. A reference frequency ($F_{ref}$) predictor circuit 22 generates a predictor out signal 64, a dump pulse signal 38, and a delayed reference clock signal 86. The predictor out signal 64 is a frequency reference clock signal. In some embodiments, the $F_{ref}$ predictor circuit 22 is a phase-lock loop (PLL) circuit and the predictor out signal 64 is a PLL output. The predictor out signal 64 and the input clock signal 8 are provided to an AND gate 24. In some embodiments, the output of the AND gate 24 is the reference pulse signal 14.

The output of the AND gate 24 is provided to a first flip-flop (or edge-triggered latch) 26a as a clock input. When the output of the AND gate 24 transitions to a high value, e.g., the input clock signal 8 and the $F_{ref}$ predictor out signal 64 are simultaneously high, the first flip-flop 24 latches a high value. A second flip-flop 26b receives the delayed reference clock signal 86 as a clock input. When the delayed reference clock signal 86 transitions from a low value to a high value, e.g., on a leading edge of the delayed reference clock signal 86, the second flip-flop 26b latches a high value. In some embodiments, the clock input of the second flip-flop 26b is coupled directly to the reference clock signal 10. The outputs of the first and second flip-flops 26a, 26b are provided to an XOR gate 28. The XOR gate 28 compares the values latched by the first and second latches 26a, 26b and outputs the delta pulse signal 12. The delta pulse signal 12 is high when only one of the first flip-flop 26a or the second flip-flop 26b is a high value.

The output of the first flip-flop 26a and the second flip-flop 26b are further provided to an AND gate 30. The output of the AND gate 30 is coupled to the clear (or reset) inputs of each of the first flip-flop 26a and the second flip-flop 26b. When both the first flip-flop 26a and the second flip-flop 26b latch high values, the AND gate 30 resets the flips-flops 26a, 26b. The output of the second flip-flop 26b is provided as a clock signal to a third flip-flop 34. The input of the third flip-flop 34 is coupled to the output of the first flip-flop 26a. When the second flip-flop 26b transitions to a high value, the third flip-flop 34 latches the value of the output of the first flip-flop 26a. The output of the third flip-flop 34 is a polarity signal 36. The polarity signal 36 is high, e.g., the output of the third flip-flop 34 is high, when the input clock signal 8 leads the reference clock signal 10. The polarity signal 36 is low, e.g., the output of the third flip-flop 34 is low, when the input clock signal 8 lags behind the reference clock signal 10. The polarity signal 36 may be provided to one or more additional circuits, such as, for example, one or more additional circuits coupled to the final conversion result signal 72. The polarity signal 36 may be used by the one or more additional circuits to identify which clock signal, e.g., the input clock signal 8 or the reference clock signal 10, leads.

In operation, the delta pulse signal 12 is generated as follows. The first and second flip-flops 26a, 26b are initially set to low (or zero) output values at a time $t_0$. At time $t_1$, the input clock signal 8 and the predictor out signal 64 are both high, causing the output of the AND gate 24 to transition to a high value. The predictor out signal 64 is high when the reference clock signal 10 is high and a delayed reference clock signal (see FIG. 3) is low. The transition of the AND gate 24 to a high output causes the first flip-flop 26a to latch a high value at the output Q. Also at time $t_1$, the output of the second flip-flop 26b is at an initial low value, resulting in the output of the XOR gate 28 to transition to a high value, corresponding to a high value for the delta pulse signal 12. At a time $t_2$, the delayed reference clock signal 86 transitions from a low value to a high value, causing the second flip-flop 26b to latch a high value at the output Q. The high output at both the first flip-flop 26a and the second flip-flop 26b has two effects: (i) causing the output of the XOR gate 28, and therefore the delta pulse signal 12, to transition to a low value; and (ii) causing the output of the AND gate 30 to transition to a high value. The high output of the AND gate 30 resets the first and second flip-flops 26a, 26b, placing the time delta detector 4a in the initial state prior to the next rising edge of the input clock signal 8 and the reference clock signal 10.

In operation, the reference pulse signal 14 is generated as follows. At time $t_0$, the output of the AND gate 24 is low (as both the input clock signal 8 and the predictor out signal 64 are initially low). At time $t_1$, the input clock signal 8 and the predictor out signal 64 are simultaneously high, causing the output of the AND gate 24 to transition to a high value. As noted above, the predictor out signal 64 is high when the reference clock signal 10 is high and a delayed reference clock signal (see FIG. 3) is low. The reference pulse 14 is tied to the output of the AND gate 24 and transitions to a high value at time $t_1$. At time $t_2$, one of the input clock signal 8 and/or the predictor out signal 64 transitions to low, causing the output of the AND gate 24 and the reference pulse signal 14 to transition to a low value.

Figure 3:
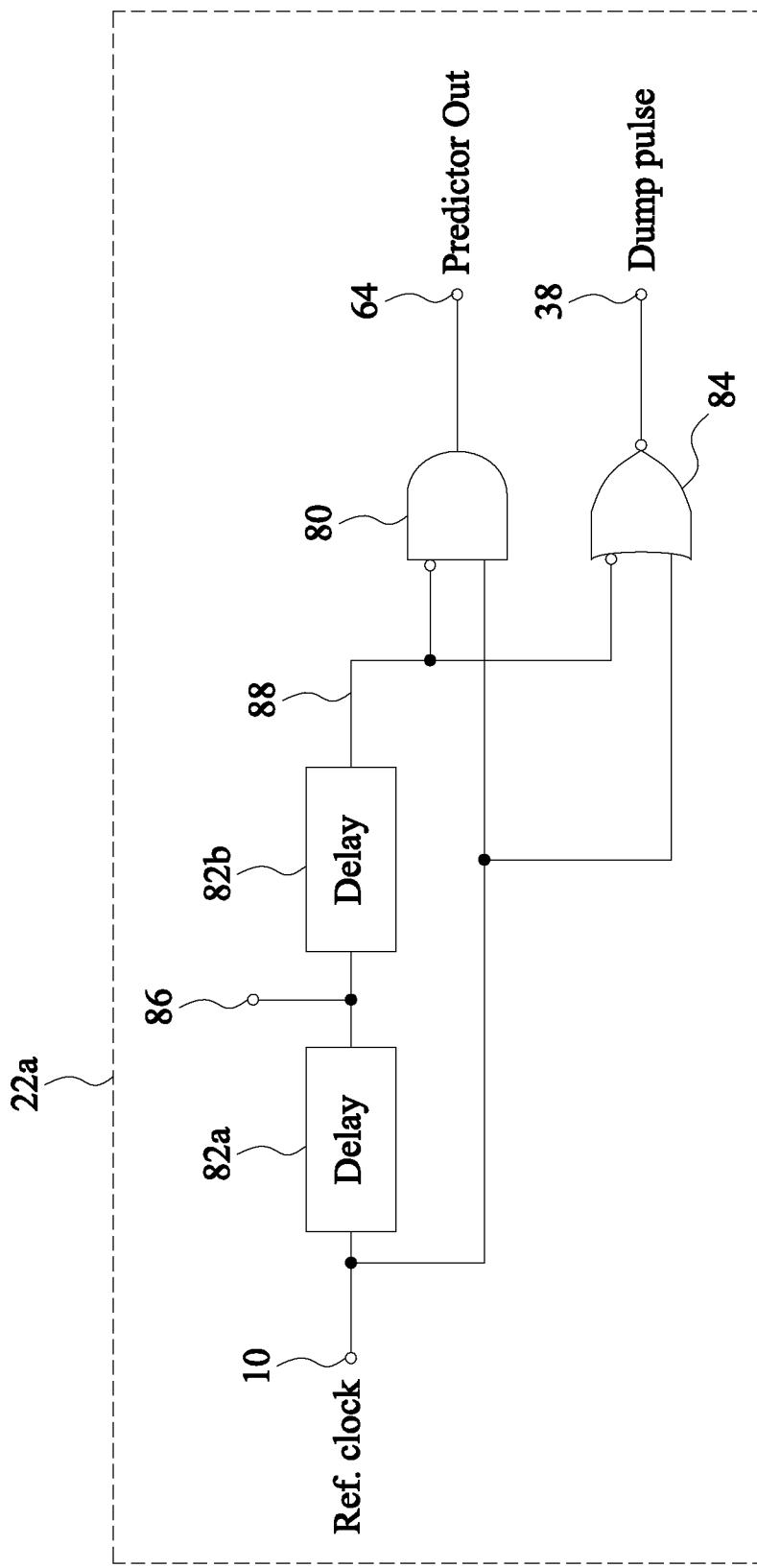
FIG. 3 illustrates one embodiment of the $F_{ref}$ predictor circuit of FIG. 2.

FIG. 3 illustrates one embodiment of a $F_{ref}$ predictor circuit 22a. The $F_{ref}$ predictor circuit 22a is configured to generate the predictor out signal 64, the dump pulse signal 38, and the delayed reference clock signal 86. The predictor out signal 64 is generated by an AND gate 80. The AND gate 80 receives the reference clock signal 10 as a first input. The reference clock signal 10 is also provided to a first delay circuit 82a. The first delay circuit 82a introduces a first predetermined delay into the reference clock signal 10. The output of the first delay circuit 82 is the delayed reference clock signal 86. The delayed reference clock signal 86 is further provided to a second delay circuit 82b. The second delay circuit 82b introduces a second predetermined delay into the delayed reference clock signal 86. The output of the second delay circuit 82b is a twice-delayed reference clock signal 88. The twice-delayed reference clock signal 88 is provided to an input of the AND gate 80. The twice-delayed reference clock signal 88 is inverted at the input of the AND gate 80. The delays of the first delay circuit 82a and the second delay circuit 82b are determined based on a window of the desired predictor out signal 64. For example, in one embodiment, the delays of the first delay circuit 82a and the second delay circuit 82b are selected such that the frequency of the input clock signal 8 and the predictor out signal 64 are the same.

The $F_{ref}$ predictor 22a is further configured to generate a dump pulse signal 38. The dump pulse signal 38 is generated by a NOR gate 84. The nor gate 84 receives the reference clock signal 10 as a first input and the twice-delayed reference clock signal 88 as a second input. The twice-delayed reference clock signal 88 is inverted at the input of the NOR gate 84. In some embodiments, the dump pulse signal 38 is provided to the comparison circuit 6 as a reset signal.

Figure 4:
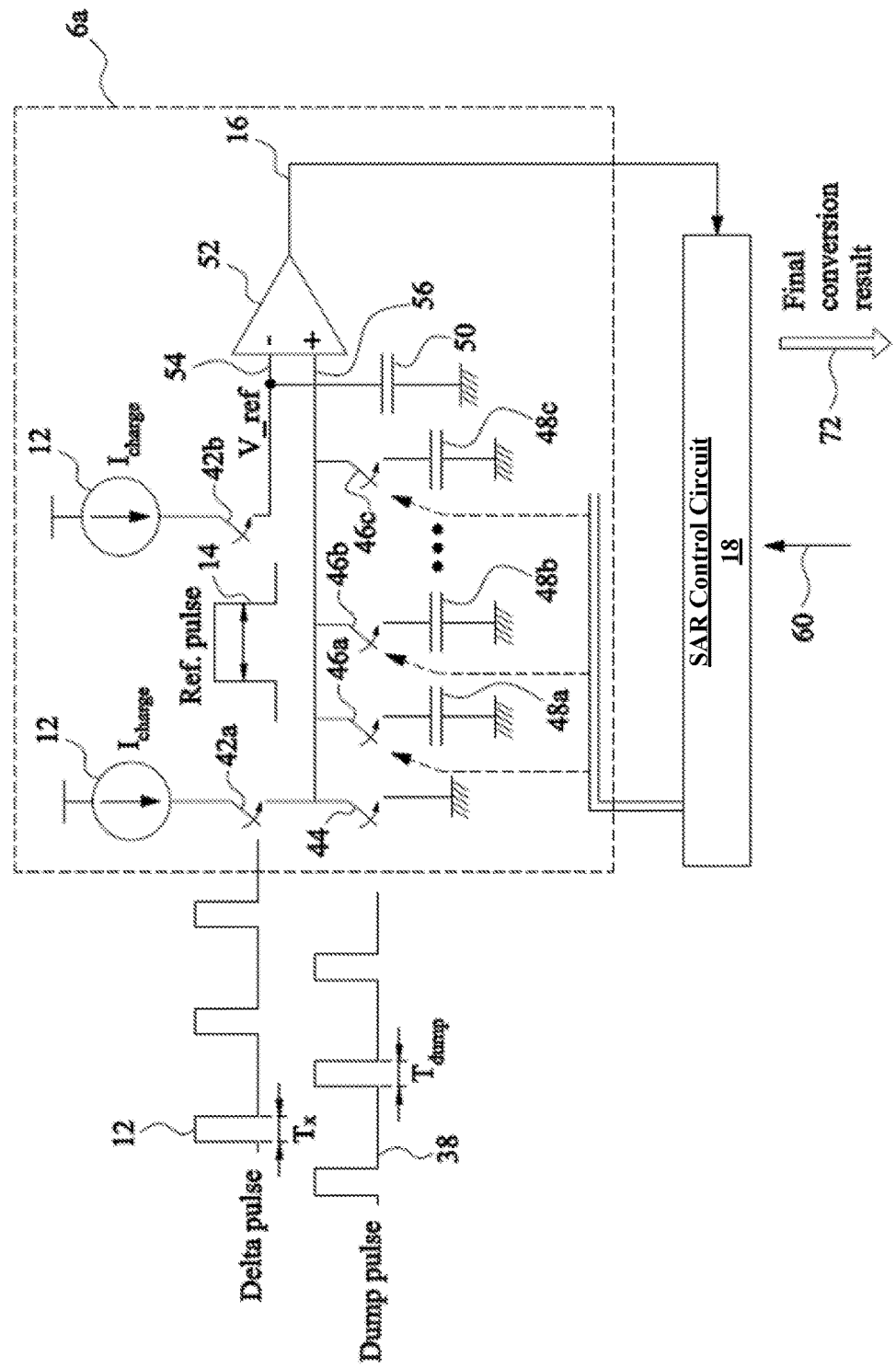
FIG. 4 illustrates one embodiment of the comparison circuit of the TDC circuit of FIG. 1.

FIG. 4 illustrates one embodiment of a comparison circuit 6a. The comparison circuit is configured to compare the pulse time of the delta pulse 12, $T_x$, with the pulse time of the reference pulse 14, $T_{ref}$, to count the time difference between the leading edge of the input clock signal 8 and the reference clock signal 10. The comparison circuit 6a includes a comparator 52 configured to compare a reference voltage 54 to a delta voltage 56. Each of the reference voltage 54 and the delta voltage 56 are generated by charging sources 40a and 40b, respectively. The charging sources 40a and 40b may include, for example, identical current sources. Each of the charging sources 40a, 40b are coupled to the comparator 52 by switches 42a and 42b, respectively.

The first charging source 40a is configured to generate a delta voltage at a first input of the comparator 52. The first charging source 40a is coupled to the comparator 52 by a first switch 42a. The first switch 42a is controlled by the delta pulse 12. A plurality of switches 46a-46c and a plurality of capacitors 48a-48c are coupled in parallel between the first charging source 40a and the comparator 52. When the first switch 42a is closed, the charging source 40a can charge a set of the plurality of capacitors 48a-48c when each have a corresponding switch 46a-46c in a closed position. For example, in one embodiment, if the first capacitor switch 46a and the first switch 42a are closed, the first capacitor 48a is charged. The first capacitor 48a will continue to charge over the length of the delta pulse 12 or until the first capacitor 48a is fully charged. The voltage developed by the capacitors 48a-48c during the pulse period $T_x$ of the delta pulse 12 is provided to the comparator 52 as a first input, e.g., the delta voltage 56.

Depending on which of the capacitor switches 46a-46c are closed, the maximum delta voltage 56 that can be applied to the first input of the comparator 52 is adjusted, allowing multiple bits of a time difference count to be determined (discussed in more detail below with respect to the SAR control circuit 18.) In one embodiment, when the delta pulse 12 is high, the first switch 42a is in a closed position, allowing a voltage to be applied by the first charging source 40a to the plurality of capacitors 48a-48c. When the delta pulse 12 is low, the switch is open and no current flows from the charging source to the capacitors 48a-48c.

In some embodiments, the number of capacitors 48a-48c is related to the maximum count period measureable by the TDC circuit 2. For example, in one embodiment, the comparison circuit 6a includes a number of capacitors N. For example, as shown in FIG. 4, the comparison circuit 6a comprises three capacitors 48a-48c. The number of capacitors N corresponds to the number of bits available to count the time difference between the clock pulses, i.e., the number of bits of resolution in the final conversion result signal 72. For example, in one embodiment, when the comparison circuit 6a includes N capacitors, the final conversion result signal 73 comprises N bits. In some embodiments, the capacitors 48a-48c include exponentially increasing capacitive values. For example, in the illustrated embodiment, the capacitors 48a-48c have weighted values of $\{2^{N-1}C, 2^{N-2}C \ldots C\}$, where C represents the capacitance of capacitor 48C. In other embodiments, the capacitors 48a-48c may include other exponential or non-exponential increasing capacitive values. A dump switch 44 is coupled to the capacitors 48a-48c and allows the capacitors 48a-48c to be discharged after the rising edge of both the input clock signal 8 and the reference clock signal 10 have occurred. In one embodiment, the dump switch 44 is controlled by the dump pulse signal 38 generated by, for example, the time delta detector 4a. Although three capacitors 48a-48c are illustrated, it will be appreciated that the comparison circuit 6a may have any number of capacitors 48a-48c corresponding to any number of bits in the final conversion result signal 72.

The second charging source 40b is configured to provide a reference voltage 54, or comparison voltage, to the comparator 52. A capacitor 50 is coupled between the second charging source 40b and the comparator 52. A second switch 42b is coupled between the second charging source 40b and the capacitor 50. The switch 42b is controlled by the reference pulse 14. When the reference pulse 14 is high, the second switch 42b is closed and the capacitor 50 begins to charge. The capacitor 50 continues charging until the reference pulse 14 transitions to a low state and/or the capacitor 50 reaches a maximum voltage. The voltage of the capacitor 50 is applied to an input of the comparator 52 as a reference voltage.

In one embodiment, the capacitance of the reference capacitor 50 is selected such that the reference voltage 54 has a higher maximum value than the highest possible delta voltage 56. For example, in the embodiment illustrated in FIG. 4, the delta voltage capacitors 48a-48c have relative values of $\{2^{N-1}C, 2^{N-2}C \ldots C\}$. The capacitors 48a-48c are connected in parallel, and therefore the maximum capacitive value of all of the delta capacitors 48a-48c is $(2^N-1)C$. The reference capacitor 50 includes a capacitive value higher than the total capacitive value of all of the delta capacitors 48a-48c connected in parallel, such as, for example, $2^NC$. Although a capacitive value of $2^NC$ is discussed herein, it will be appreciated that other capacitive values higher than the total capacitive value of the delta capacitors 48-48c may be used. The higher capacitive value of the reference capacitor 50 ensures that the reference voltage 54 can have a higher maximum value than the maximum delta voltage 56. In some embodiments, the time of the delta pulse, $T_x$ is determined by the equation:

$$T_x = 2^{x-N} T_{ref}$$

In other embodiments, the time of the delta pulse is determined by the equation:

$$T_x = x \cdot 2^{-N} \cdot T_{ref}$$

where $T_{ref}$ is the pulse time of the reference pulse 14, and x is a final control code of the SAR control circuit 18. In other words, the final control code x is an integer value indicating which of the switches 46a-46c are closed by the SAR control circuit 18 corresponding to the LSB of the time difference count, where $1 \leq x \leq 2^N - 1$. The final control code x is determined by the SAR control circuit 18 during operation. The longer the delta pulse 12, the greater the value of the final control code x.

The output of the comparator 52 includes one bit of the binary time difference count between the input clock signal 8 and the reference clock signal 10. In the illustrated embodiment, when the delta voltage 56 is higher than the reference voltage 54, the comparator 52 generates a high, or logic 1 value, indicating that the current bit of the count is 1. If the value of the delta voltage 56 is lower than the reference voltage 54, the comparator 52 generates a low, or logic 0, value indicating that the current bit of the count is 0. The output of the comparator 52 is provided to the SAR control circuit 18.

In some embodiments, the SAR control circuit 18 maintains a digital count of the time difference between the input clock pulse 4 and the reference clock pulse 6. For example, in some embodiments, the SAR control circuit 18 comprises one or more circuit elements, such as, for example, registers, latches, and/or other suitable elements to store the bit values output by the comparison circuit 6. The SAR control circuit 18 generates a plurality of weighting control signals 62, as shown in FIG. 1. The weighting control signals 62 adjust a maximum value of the delta voltage 56 input to the comparator 52 to perform a binary search to generate each bit of the time delay count, from the MSB to the LSB. For each additional delta capacitor 48a-48c that is open/closed, the maximum value of the delta voltage is varied, allowing each bit of the time difference measurement to be sequentially determined, as described in more detail below. After each pulse of the delta pulse signal 12, the dump pulse signal 38 allows the delta capacitors 48a-48c to discharge and reset to measure a subsequent pulse.

In some embodiments, the delta capacitors 48a-48c are controlled and hence coupled to the first charging source 40a by the SAR control circuit 18 based on the bit-position of the current bit within the binary count and/or the comparator output of the previous bit. For example, in an initial state, the SAR control circuit 18 closes a first switch 46a to couple a first delta capacitor 48a to a first charging source 40a. The first delta capacitor 40a corresponds to a MSB ($2^{N-1}$) of the binary count of the time difference between the input clock signal 8 and the reference clock signal 10. The first charging source 40a charges the first delta capacitor 48a for a predetermined time period, such as, for example, the pulse time $T_x$ of the delta pulse 12. After the predetermined time period, the comparator 52 compares the delta voltage 56 to the reference voltage 54. If the comparator 52 output is 1 (e.g., the MSB of the binary count is a 1), the SAR control circuit closes a second switch 46b corresponding to the next-most significant bit (e.g., MSB-1). If the comparator output is 0 (e.g., the MSB of the binary count is 0), the SAR control circuit closes the second switch 46b and opens the first switch 46a.

The second delta capacitor 48b corresponds to the second-most significant bit ($2^{N-2}$). The second delta capacitor 48b (and the first delta capacitor 48a if connected) is charged by the first charging source 40a for a predetermined time period, such as, for example, the pulse time $T_x$ of the delta pulse 12. After the predetermined time period, the comparator 52 compares the delta voltage 56 to the reference voltage 54. If the output of the comparator 52 is high (e.g., the MSB-1 is a binary 1), the SAR control circuit closes the third switch 46c while maintaining all of the previously closed switches in a closed state (e.g., if the MSB was a binary 1, the first switch 46a is maintained in a closed state). The SAR control circuit 18 iterates through each of the bits of the binary count from the MSB to the LSB. In some embodiments, the dump pulse 38 causes the delta capacitors 48a-48c to discharge between each bit of the count. In other embodiments, the dump pulse 38 discharges the delta capacitors 48a-48c after the total binary count of the time difference is determined.

The SAR control circuit 18 receives a control clock input 60. The control clock input 60 resets the SAR control circuit 18 after a falling edge of each of the input clock signal 8 and the reference clock signal 10. For example, in one embodiment, the control clock input 60 is operated at a frequency of $N^*F_{ref}$, e.g., the frequency of the control clock is N times the frequency of the reference clock signal 14, where N is the number of bits, or resolution, in the time difference count. The final binary count of the time difference between the input clock signal 8 and the reference clock signal 10 is output by the SAR control circuit 18 as the final conversion result 72. The final conversion result 72 may output each bit of the binary count serially and/or in parallel.

Figure 5:
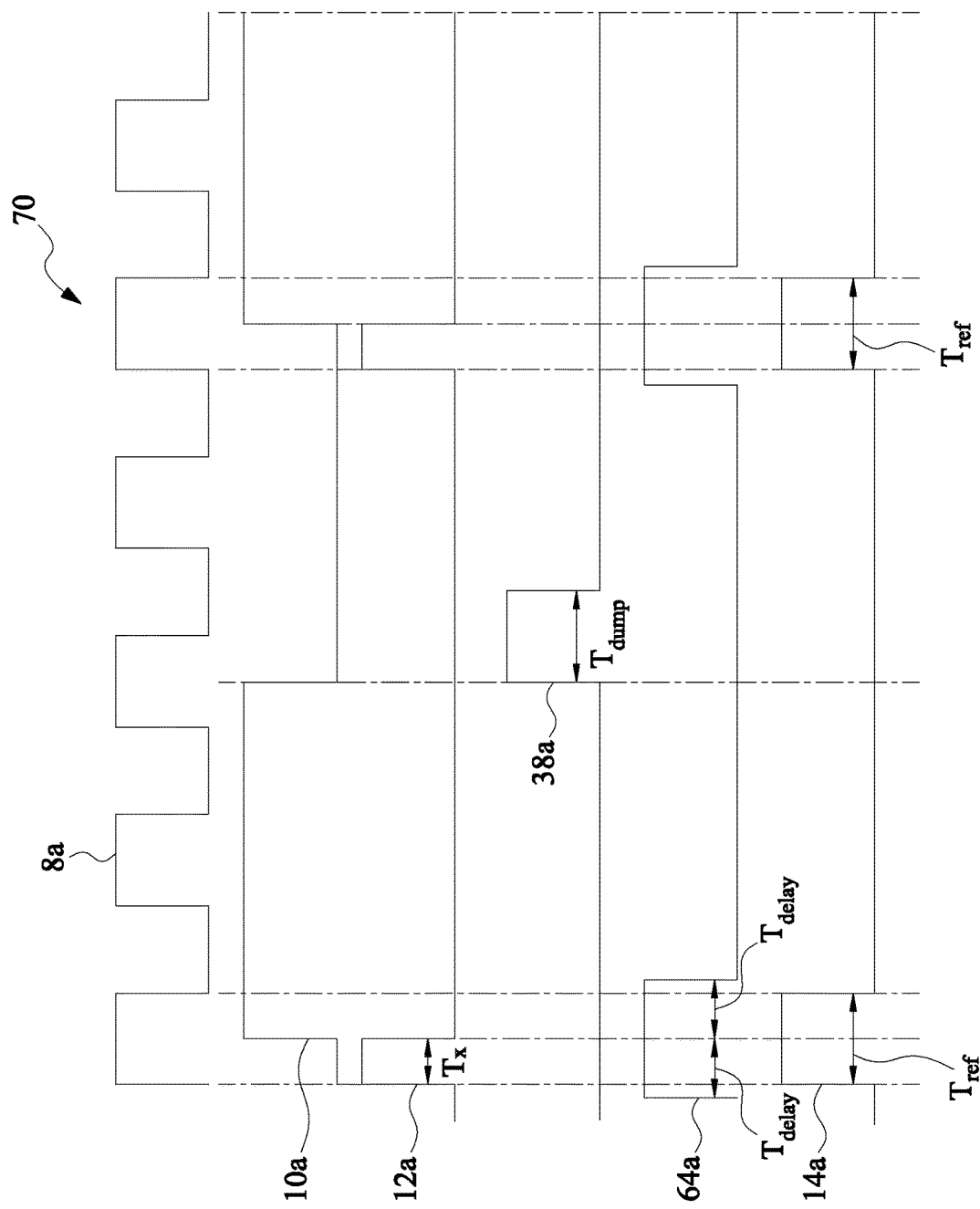
FIG. 5 illustrates one embodiment of an operational timing diagram of the TDC circuit of FIG. 1.

FIG. 5 illustrates one embodiment of an operational timing diagram 70 of the TDC circuit 2. The input clock signal 8a and the reference clock signal 10a illustrate examples of the input clock signal 8 and the reference clock signal 10, respectively. The input clock signal 8a and the reference clock signal 10a are provided to the time delta detector 4 which generates the predictor out signal 64a using a predictor circuit, such as, for example, the $F_{ref}$ predictor circuit 22 illustrated in FIG. 2. The time delta detector 4 generates the delta pulse 12a and the reference pulse 14a. As shown in FIG. 5, the delta pulse 12a is generated when the predictor signal 64a is high, the input clock signal 8a is high, and the reference clock signal 10a is low. A dump pulse signal 38a is generated to reset the comparison circuit 6 on the falling edge of the reference clock signal 10a.

As shown in FIG. 5, in one embodiment, the input clock signal 8a leads the reference clock signal 10a, i.e., a rising edge of the input clock signal 8a occurs before a rising edge of the reference clock signal 10a. The delta pulse 12a corresponds to the time period between the leading edge of the input clock signal 8a and the leading edge of the reference clock signal 10a. As shown in FIG. 5, the delta signal 12a is generated only during period between the rising edge of the input clock signal 8a and the rising edge of the reference clock signal 10a. In other words, the delta pulse signal 12a has a pulse time, $T_x$ equal to the time difference between the input clock signal 8a and the reference clock signal 10a. The pulse time $T_x$ of the delta pulse signal 12a is used to determine the count output by the comparison circuit 6.

As noted above, the dump pulse signal 38a is generated to reset the comparison circuit 6. The dump pulse signal 38a is generated after a falling edge of the input clock signal 8a and a falling edge of the reference clock signal 10a have occurred. The dump pulse signal 38a is maintained for a pulse period of $T_{dump}$. In some embodiments, $T_{dump}$ may be adjusted such that the pulse period $T_{dump}$ comprises a predetermined time period sufficient for all one or more of the capacitors 48a-48c of the comparison circuit 6a to discharge.

A reference pulse signal 14a is generated when both the input clock signal 8a and the predictor out signal 64a are high, as shown in FIG. 2. The reference pulse signal 14a is provided to a comparison circuit 6 and may, for example, be used to generate a comparison voltage. In some embodiments, the reference pulse signal 14a can be generated directly by the input clock signal, a reference clock signal, and/or based on one or more input and/or generated signals. For example, in some embodiments, the reference pulse signal 14a may be generated by a PLL circuit.

Figure 6:
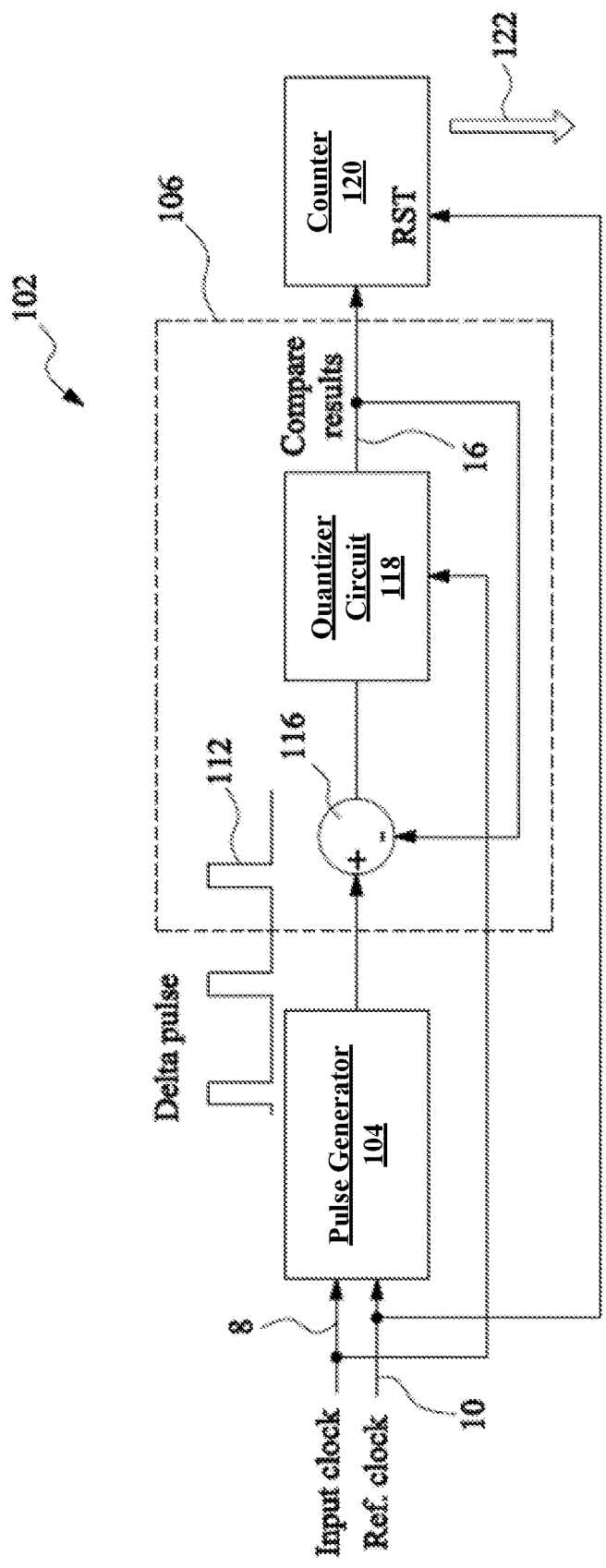
FIG. 6 illustrates one example embodiment of a TDC circuit including a spatial division multiplexing (SDM) circuit.

FIG. 6 illustrates one embodiment of a TDC circuit 102 including a pulse generator 104 and a spatial division multiplexing (SDM) circuit 106. The TDC circuit 102 is configured to count a time difference between two clock signals, such as, a time difference between the rising edges of two clock signals, an input clock signal 8 and a reference clock signal 10. The pulse generator 104 is configured to generate one or more pulses based on one or more input signals. For example, in the illustrated embodiment, the pulse generator 104 receives an input clock signal 8 and a reference clock signal 10 and generates a time delta pulse 112. The pulse generator 104 can generate additional signals, such as, for example, a reference pulse signal, a polarity signal, a dump pulse signal, and/or one or more additional signals. The pulse generator 104 may include, for example, a time delta detector as described above with reference to FIG. 2. The time delta pulse 112 is provided to the SDM circuit 106.

The SDM circuit 106 is configured to generate a comparison result signal 16. The comparison result signal 16 is indicative of one or more bits of a binary count of the time difference between the input clock signal 8 and the reference clock signal 10. The comparison result signal may be generated by, for example, comparing voltage values generated over a delta pulse 112 period. For example, in some embodiments, a difference between a first voltage value generated over a delta pulse period 112 and a second voltage value corresponds to at least one bit of a count of a time difference between a rising edge of the input clock signal 8 and the reference clock signal 10. In some embodiments, the SDM circuit 106 includes a convertor 116 and a quantizer circuit 118. As discussed in more detail below, in some embodiments, the convertor circuit 116 comprises one or more circuits configured to convert a pulse period, such as, for example, the delta pulse period, into a reference voltage. The quantizer 118 comprises one or more circuits configured to quantize the voltages generated by the convertor circuit 116 into a binary output, such as, for example, the comparison result signal 16. The comparison result signal 16 generated by the SDM circuit 106 is provided to a counter 120. The counter 120 is configured to maintain the count of the time difference between the input clock signal 8 and the reference clock signal 10. The counter 120 outputs the final count result 122.

Figure 7:
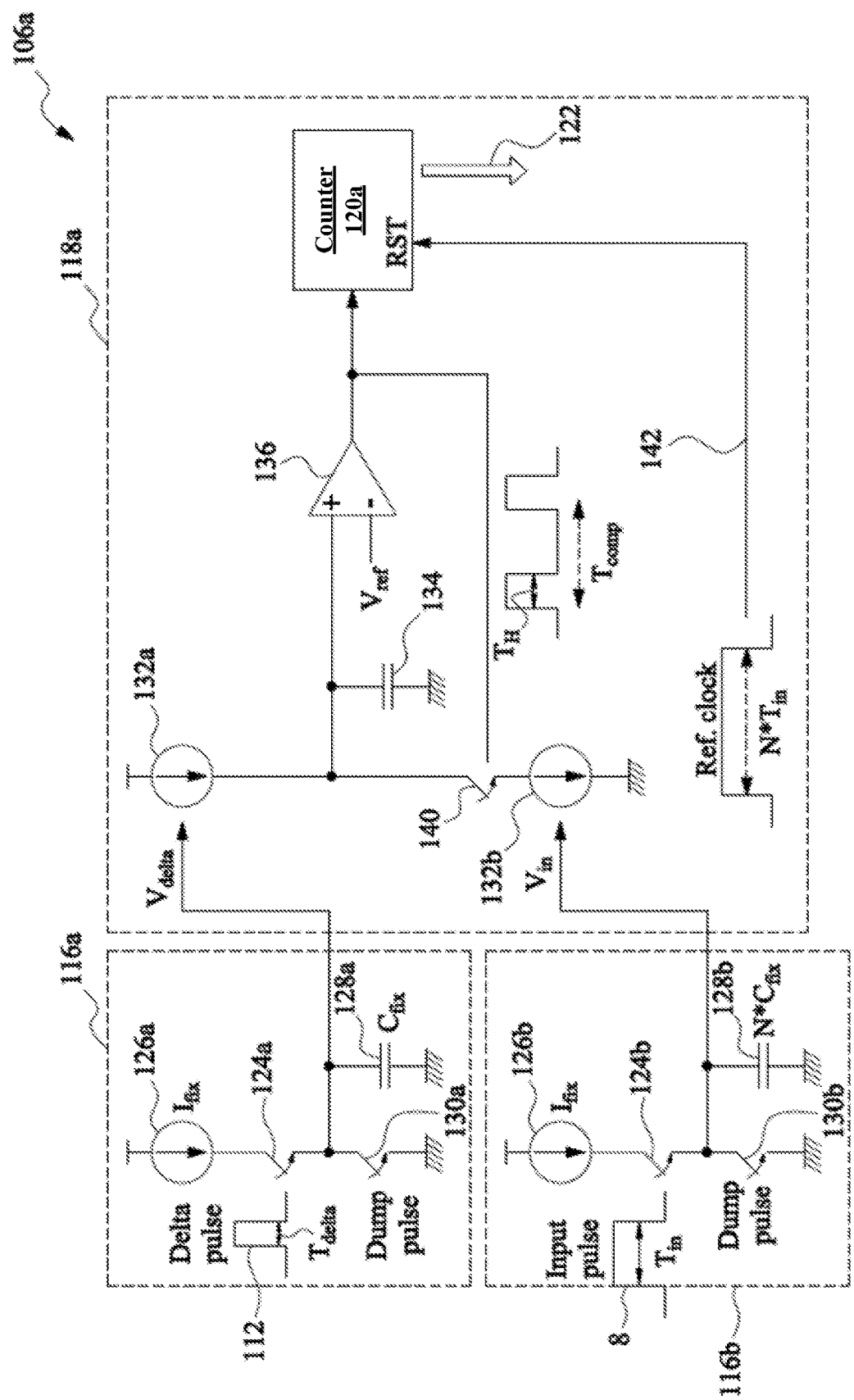
FIG. 7 illustrates one embodiment of the SDM circuit of the TDC circuit of FIG. 6.

FIG. 7 illustrates one embodiment of an SDM circuit 106a. The SDM circuit 106a includes a first convertor 116a and a second convertor 116b. The first convertor 116a includes a first switch 124a. The first switch 124a is controlled by the delta pulse signal 112. When the delta pulse signal 112 is high, the first switch 124a is closed and when the delta pulse 112 is low, the first switch 124a is open. A charging source 126a is coupled to a first side of the first switch 124a. The charging source 126a provides a charging current of $I_{fix}$. When the first switch 124a is in a closed position, the charging source 126a charges a capacitor 128a. The capacitor 128a includes a capacitance $C_{fix}$. The voltage potential developed on the capacitor 128a is provided to an input of a quantizer circuit 118a. A second, or dump, switch 130a is coupled to the capacitor 128a and controlled by a dump pulse. When the dump pulse is high, the capacitor 128a discharges and resets the first converter 116a. In some embodiments, the dump pulse is generated by the pulse generator 104.

The second convertor 116b includes a first switch 124b. The first switch 124b is controlled by an input pulse signal 8 such that when the input pulse signal 8 is high, the first switch 124b is closed and when the input pulse signal 8 is low, the first switch 124b is open. A charging source 126b is coupled to a first side of the first switch 124b. The charging source 126b provides a charging current equal to the charging current provided by the charging source 126a, e.g., $I_{fix}$. When the first switch 124b is in a closed position, the charging source 126b charges a capacitor 128b. The capacitor 128b includes a capacitance of $N*C_{fix}$, where N is the number of bits of resolution used in the binary count of the time difference between a rising edge of the input clock signal 8 and a rising edge of the reference clock signal 10. The voltage potential developed on the capacitor 128b is provided to an input of the quantizer circuit 118a. A second, or dump, switch 130b is coupled to the capacitor 128b and controlled by a dump pulse. When the dump pulse is high, the capacitor 128b discharges and resets the second convertor 116b.

The voltage output of the first convertor 116a and the second convertor 116b are provided as inputs to the quantizer circuit 118a. The voltage output of the first convertor 116, $V_{delta}$, is provided to a first source 132a of the quantizer 118a. The first source 132a generates a charging current that charges a capacitor 134. The voltage potential developed on the capacitor 134 is provided as a first input of a comparator 136. The voltage potential developed on the capacitor 134 is compared to a reference voltage, $V_{ref}$. The output of the comparator 136 is provided to the counter 120 as one bit of the binary count of the time difference between the input clock signal 8 and the reference clock signal 10. The output of the comparator 136 is coupled to a switch 140. When the output of the comparator 136 is high, the switch 140 is closed. When then output of the comparator 136 is low, the switch 140 is open. The switch 140 couples a second source 132b to the capacitor 134. The second source 132b receives an input voltage, $V_{in}$, from the second convertor 116b. The second source 132b is configured to adjust the voltage of the capacitor 134 to weight the output of the comparator 136 based on the position of the binary bit of the count, e.g., from the MSB to the LSB. When the second source 132b is coupled to the capacitor (e.g., the output of the comparator 136 is high), the second source 132b reduces the input current and/or voltage of the firsts source 132a, resulting in a lower voltage being developed in the capacitor 134.

The counter 120a maintains a count of the time difference between a rising edge of the input clock signal 8 and a rising edge of the reference clock signal 10. The counter 120a comprises one or more circuit elements configured to maintain the count, such as, for example, registers, latches, and/or any other suitable elements. The count is based on the input received from the comparator 136. The final conversion result output 122 is generated by the counter 120a when all of the bits of the count have been determined by the comparator 136. The counter 120a may be any suitable counter such as, for example, an asynchronous counter. A reference clock signal 142 of $N*T_{in}$ is coupled to a reset of the counter 120a, where N is the number of bits of resolution in the count and $T_{in}$ is the pulse time of the input pulse signal 8.

Figure 8:
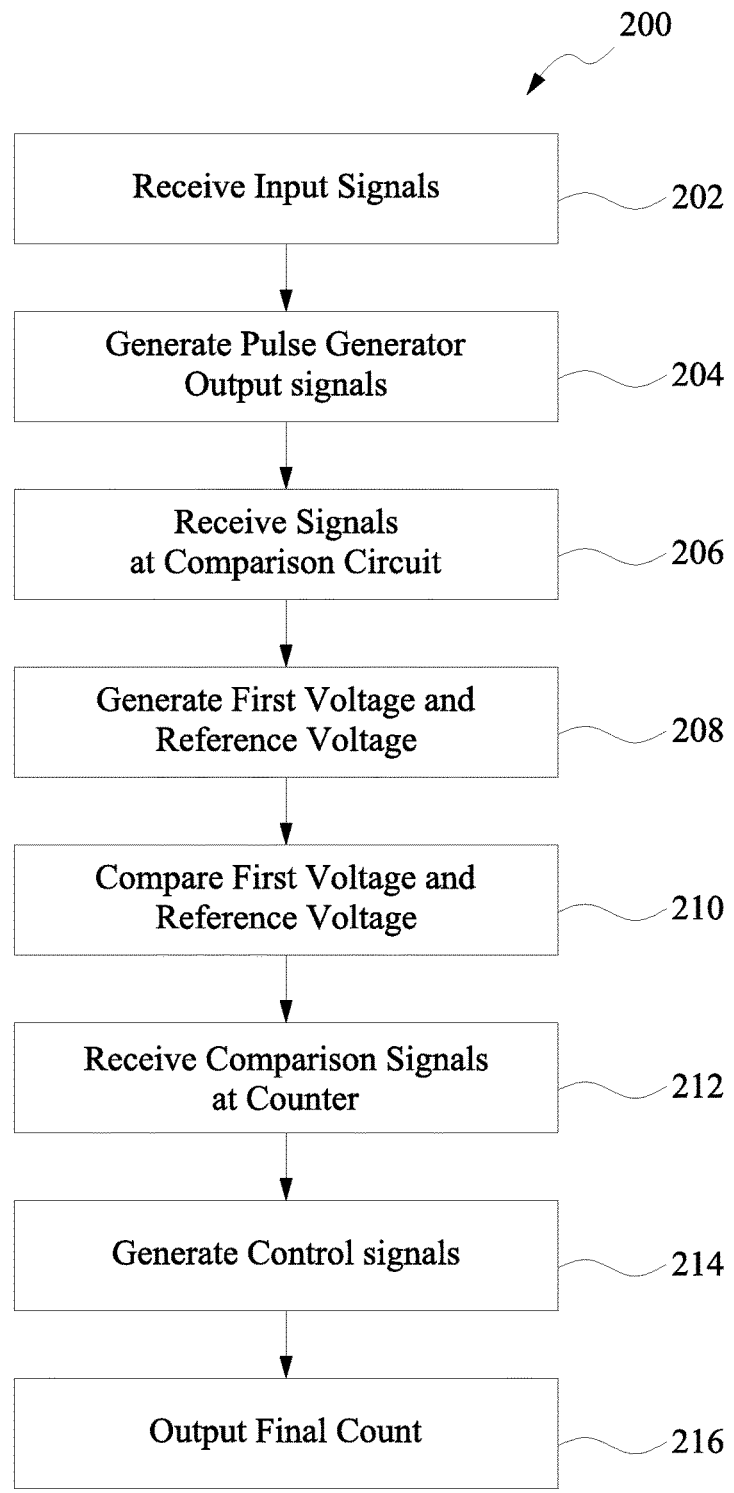
FIG. 8 is a flowchart illustrating one embodiment of a method for counting a time delay between a first input signal and a second input signal.

FIG. 8 is a flowchart illustrating one embodiment of a method 200 for counting a time difference between a first input signal and a second input signal. In a first step 202, a pulse generator receives a first input signal and a second input signal. For example, a pulse generator 4 or a pulse generator 104 can receive an input clock signal 8 and a reference clock signal 10. In a second step 204, the pulse generator generates one or more signals based on the first input signal and the second input signal. The generated pulses can include, for example, a delta pulse signal, a reference pulse signal, a polarity signal, and/or a dump pulse signal.

In a third step 206, one or more of the generated signals and/or one or more of the input signals are received by a comparison circuit. In a fourth step 208, the comparison circuit generates a first voltage value and a reference voltage value. The first voltage value and/or the reference voltage value can be generated by charging one or more capacitors. For example, in one embodiment, a first voltage is generated by charging a set of capacitors selected from a plurality of capacitors. The set of capacitors are charged by closing a switch to connect the capacitors to a charging source. The switch can be controlled by one of the signals generated by the pulse generator, such as, for example, the delta pulse signal. As another example, the reference voltage can be generated by charging a capacitor by closing a switch to connect the capacitor to a charging source. The switch can be controlled by one of the signals generated by the pulse generator, such as, for example, the reference pulse signal.

In a fifth step 210, the comparison circuit compares the first voltage and the reference voltage and outputs a comparison signal representative of a bit of the count of the time difference between the first input signal and the second input signal. For example, in one embodiment, if the first voltage is greater than the reference voltage, the comparison circuit generates a high, or binary 1, output. In a sixth step 212, the comparison signal is received by a counter that maintains a binary count of the time difference between the first input signal and the second input signal. The counter may be, for example, a stand-alone regulator (SAR) control circuit and/or a binary counter circuit. The counter is updated based on the comparison signal received by the counter. In a seventh step 214, the counter generates a control signal to weight the output of the comparison circuit based on a bit position within the binary count. In an eighth step 216, the counter outputs a final count of the time difference between the first input signal and the second input signal.

In some embodiments, a circuit is disclosed. The circuit includes a time delta detector configured to receive an input clock signal and a reference clock signal. The time delta detector generates a delta pulse signal and a reference pulse signal. A comparison circuit is configured to receive the delta pulse signal and the reference pulse signal. The comparison circuit generates an output indicative of a bit of a time difference between the input clock signal and the reference clock signal. A control circuit configured to receive the output from the comparison circuit, and wherein the control circuit maintains a count of the time difference between the input clock signal and the reference clock signal.

In some embodiments the time delta detector generates the delta pulse signal and the reference pulse signal based on state changes of the input clock signal and the reference clock signal. In some embodiments, the time delta detector includes a reference frequency predictor. In some embodiments, the time delta detector is configured to generate a polarity signal, a dump pulse, and a delayed reference clock signal.

In some embodiments, a first input to the comparison circuit, can include a first input source and a plurality of capacitors coupled in parallel between the input source and the comparator. The plurality of capacitors can include N capacitors, where N is a number of bits of resolution in the count of the time difference between the rising edge of the input clock signal and the rising edge of the reference clock signal. The capacitance of the plurality of capacitors can be the group $\{2^{N-1}C, 2^{N-2}C \ldots C\}$.

In some embodiments, a second input to the comparison circuit includes a second input source and an input capacitor coupled in parallel between the second input source and the comparison circuit. The input capacitor can have a capacitance of $2^N C$. In some embodiments, the first input source and the second input source are identical. The control circuit can be configured to control the plurality of capacitors to weight the output of the comparison circuit.

In some embodiments, the circuit includes a plurality of switches comprising N switches. Each of the plurality of capacitors is coupled to a respective switch of the plurality of switches. The control circuit is configured to control the plurality of switches to weight the output of the comparison circuit.

In some embodiments, a circuit includes a pulse generator configured to receive an input clock signal and a reference clock signal and generate a delta pulse signal. A spatial division multiplexing circuit is configured to receive the delta pulse and the reference clock signal and generate an output indicative of the time difference between the input clock signal and the reference clock signal. A counter is configured to maintain a count of the time difference between the input clock signal and the reference clock signal.

In some embodiments, the spatial division multiplexing circuit includes at least one convertor circuit and at least one quantizer circuit. The at least one convertor circuit can include a charging source coupled to a first side of a switch and a capacitor coupled to a second side of the switch. The switch is controlled by a pulse generated by the pulse generator. The at least one convertor circuit generates an output voltage.

In some embodiments, the circuit includes a first convertor circuit and a second convertor circuit. The first convertor circuit is controlled by a delta pulse generated by the pulse generator. The second convertor circuit is controlled by an input pulse. The quantizer can include a first source and a second source. The first source generates an input current based on an output voltage of the first convertor circuit and the second source generates an input current based on an output voltage of the second source. The quantizer can be a comparator configured to receive a first input voltage and a second input voltage. The first input voltage is generated by a capacitor coupled to the first source and the second source. The second input voltage of the comparator can be a reference voltage.

In some embodiments, a method of time to digital conversion is disclosed. The method includes receiving an input clock signal and a reference clock signal. A delta pulse signal and a reference pulse signal are generated from the input clock signal and the reference clock signal. A first voltage is generated based on a pulse time of the delta pulse signal and a second voltage is generated based on a pulse time of the reference pulse signal. The first voltage and the second voltage are compared to generate a count of the time difference between the input clock signal and the reference clock signal. In some embodiments, the first voltage is generated by connecting a set of capacitors to a first input of a comparator, connecting the set of capacitors to a first charging source, and charging the set of capacitors over the pulse time of the delta pulse signal. The set of capacitors can be connected to the charging source by a switch controlled by the delta pulse signal. In some embodiments, the second voltage is generated by connecting a reference capacitor to a second input of the comparator, connecting the reference capacitor to a second charging source, and charging the reference capacitor over the pulse time of the reference pulse signal. The reference capacitor is connected to the second charging source by a switch controlled by the reference pulse signal. The second charging source can be identical to the first charging source Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A circuit, comprising:
  a pulse generator configured to receive an input clock signal and a reference clock signal and generate a delta pulse signal;
  a spatial division multiplexing circuit configured to receive the delta pulse signal and the reference clock signal and generate an output indicative of a time difference between the input clock signal and the reference clock signal; and a counter configured to maintain a count representing the time difference between the input clock signal and the reference clock signal.

2. The circuit of claim 1, wherein the spatial division multiplexing circuit comprises at least one convertor circuit and at least one quantizer circuit.

3. The circuit of claim 2, wherein the at least one convertor circuit comprises a charging source coupled to a first side of a switch and a capacitor coupled to a second side of the switch, wherein the switch is controlled by a pulse generated by the pulse generator, and wherein the at least one convertor circuit generates an output voltage.

4. The circuit of claim 3, wherein the at least one convertor circuit comprises a dump switch coupled to the second side of the switch and the capacitor, wherein the dump switch is configured to discharge the capacitor.

5. The circuit of claim 3, wherein the charging source is a current source.

6. The circuit of claim 2, wherein the at least one convertor circuit comprises a first convertor circuit and a second convertor circuit, wherein the first convertor circuit is controlled by a delta pulse generated by the pulse generator, and wherein the second convertor circuit is controlled by an input pulse.

7. The circuit of claim 6, wherein the at least one quantizer comprises a first source and a second source, wherein the first source generates an input current based on an output of the first convertor circuit and the second source generates an input current based on an output of the second convertor circuit.

8. The circuit of claim 7, wherein the quantizer comprises a comparator configured to receive a first input voltage and a second input voltage, wherein the first input voltage is generated by a capacitor coupled to the first source and the second source.

9. The circuit of claim 8, wherein the second input voltage of the comparator comprises a reference voltage.

10. The circuit of claim 8, wherein the reference clock signal is provided to the comparator as a reset signal.

11. The circuit of claim 1, wherein the pulse generator comprises a time delta detector.

12. The circuit of claim 11, wherein the time delta detector generates the delta pulse signal and the reference pulse signal based on state changes of the input clock signal and the reference clock signal.

13. The circuit of claim 11, wherein the time delta detector comprises a reference frequency predictor.

14. The circuit of claim 11, wherein the time delta detector is configured to generate a polarity signal, a dump pulse, and a delayed reference clock signal.

15. A method of time-to-digital conversion, the method comprising:

receiving an input clock signal and a reference clock signal;

generating a delta pulse signal from the input clock signal and the reference clock signal;

coupling a first capacitor to a first source during a first period defined by the delta pulse signal;

coupling a second capacitor to a second source during a second period defined by the input clock signal; and comparing a total voltage generated by the first and second capacitors to a reference voltage; and incrementing a count representative of a time difference between the input signal and the reference clock signal based on the total voltage.

16. The method of claim 15, wherein the first capacitor is coupled to the first source by a first switch configured to receive the delta pulse signal and the second capacitor is coupled to the second source by a second switch configured to receive the input clock signal.

17. The method of claim 15, wherein the total voltage is generated by coupling the first and second capacitors to a third capacitor, and wherein the third capacitor is charged by a voltage difference between the first and second capacitors.

18. A circuit, comprising:

a pulse generator configured to receive an input clock signal and a reference clock signal and generate a delta pulse signal and an input pulse signal;

a spatial division multiplexing circuit configured to receive the delta pulse signal and the input pulse signal and generate an output indicative of a time difference between the input clock signal and the reference clock signal; and a counter configured to maintain a count representative of the time difference between the input clock signal and the reference clock signal.

19. The circuit of claim 18, wherein the spatial division multiplexing circuit comprises a first convertor circuit configured to receive the delta pulse signal and generate a delta voltage output and a second convertor circuit configured to receive the input pulse signal and generate an input voltage output.

20. The circuit of claim 19, wherein each of the first and second convertor circuits comprise a charging source coupled to a first side of a switch and a capacitor coupled to a second side of the switch, wherein the switch is controlled by one of the delta pulse signal or the input pulse signal.

* * * * *